United States Patent

Ismail et al.

[11] Patent Number: 5,955,759
[45] Date of Patent: Sep. 21, 1999

[54] REDUCED PARASITIC RESISTANCE AND CAPACITANCE FIELD EFFECT TRANSISTOR

[75] Inventors: Khalid EzzEldin Ismail, White Plains, N.Y.; Stephen Anthony Rishton, Hayward, Calif.; Katherine Lynn Saenger, Ossining, N.Y.

[73] Assignee: International Business Machines Corporation, Armonk, N.Y.

[21] Appl. No.: 08/989,042

[22] Filed: Dec. 11, 1997

[51] Int. Cl.$^6$ ............................................. H01L 29/72
[52] U.S. Cl. ................. 257/332; 257/401; 257/618; 438/159; 438/182; 438/229; 438/259
[58] Field of Search .................... 257/332, 401, 257/618; 438/159, 182, 229, 259

[56] References Cited

U.S. PATENT DOCUMENTS

| | | |
|---|---|---|
| 5,089,863 | 2/1992 | Satoh et al. . |
| 5,196,357 | 3/1993 | Boardman et al. ............ 438/159 |
| 5,231,038 | 7/1993 | Yamaguchi et al. . |
| 5,268,330 | 12/1993 | Givens et al. . |
| 5,272,100 | 12/1993 | Satoh et al. . |
| 5,405,787 | 4/1995 | Kurimoto . |
| 5,464,782 | 11/1995 | Koh . |

FOREIGN PATENT DOCUMENTS

| | | |
|---|---|---|
| 4-180633 | 6/1992 | Japan . |
| 6-350085 | 12/1994 | Japan . |
| 250579 | 7/1995 | Taiwan . |
| 266313 | 12/1995 | Taiwan . |

OTHER PUBLICATIONS

A. Acovic et al., "Novel Gate Process for 0.1 Micron MOSFETs", IBM Technical Disclosure Bulletin, vol. 36, No. 11, pp. 455–457 (Nov. 1993).

Primary Examiner—Edward Wojciechowicz
Attorney, Agent, or Firm—Scully, Scott, Murphy & Presser; Robert M. Trepp

[57] ABSTRACT

A field effect transistor and method for making the same is described wherein the field effect transistor incorporates a T-shaped gate and source and drain contacts self-aligned with preexisting shallow junction regions. The present invention provides a low resistance gate electrode and self-aligned low resistance source/drain contacts suitable for submicron FET devices, and scalable to smaller device dimensions.

29 Claims, 6 Drawing Sheets

REDUCED PARASITIC RESISTANCE AND CAPACITANCE FIELD EFFECT TRANSISTOR

DESCRIPTION

1. Technical Field

The present invention relates to semiconductor and more particularly to self-aligned metal oxide semiconductor (MOS) field effect transistors (FETs) having submicron gate lengths with a T-shaped gate.

2. Prior Art

State of the art metal oxide semiconductor (MOS) field effect transistors (FETs) require shrinking the gate length below 0.25 æm. The standard process for forming the gate is by depositing a polysilicon layer, etching this layer to define the required gate length, and using polysilicon as a mask for the source/drain shallow implant step. The shallow implant step is followed by forming a nitride sidewall spacer, implanting the deep ohmic region in the source/drain region and then forming a metal silicide to the gate and the source/drain implant. The resistance of the gate thus increases as the gate length is reduced, because the gate metal silicide has the same gate length as the polysilicon gate underneath. The gate resistance slows down the device because of the RC time delay. Alternatively, one can form a metal gate which is longer than the polysilicon gate by opening a window in an oxide layer and patterning the metal. This process has produced the fastest silicon devices known to date, but requires highly critical realignment to the initial polysilicon gate, which, if not successful, would result in shorting the gate with the ohmic source/drain contacts. Therefore, the above process is not compatible with semiconductor manufacturing.

As gate lengths shrink in MOS FETs, the ohmic source/drain contacts must be sealed in depth to keep the aspect ratio of gate length to junction depth greater than 1. This requirement for shallow junctions places an upper limit on the amount of silicon from the junction that can be consumed to form low resistivity metal silicide contacts. The higher resistance associated with thinner silicide source/drain contacts can further degrade the speed performance of the FETs.

SUMMARY OF THE INVENTION

In accordance with the present invention, a structure and process sequence is described for fabricating field effect transistors which can easily be scaled to submicron dimensions both in length and in width. The process relies on forming raised source/drain contacts self-aligned to preexisting junction regions and then forming the gate dielectric and a self-aligned metal or metal/polysilicon gate which may be T-shaped in order to reduce the parasitic gate resistance.

The present invention provides a process for forming the gate stack, which allows a T-shaped metal gate with no critical alignment steps, and which results in a greatly reduced gate resistance.

The present invention further provides a new process that allows for the formation of T-gates, self-aligned to existing shallow source/drain contacts, without any critical alignment needed, for example, an alignment accuracy of about 0.2 æm for a gate length in the range of 0.05 to 0.2 æm is achieved by the present invention.

The instant invention further provides a new alternative process where the gate is formed by metal or metal/polysilicon combination, without any silicidation needed, and results in an extremely low gate contact resistance.

The instant invention further provides a process wherein high conductivity source/drain contacts, self-aligned to preexisting shallow junction regions are deposited prior to the gate dielectric and gate conductor. The preexisting shallow junction region may preferably be formed by ion implantation followed by activation of annealing, by spatially selective epitaxial growth of an in-situ doped semiconductor, or by a process such as gas immersion laser doping (GILD) in which junction regions are irradiated by high intensity laser light in the presence of a gas containing atoms of the dopant.

The present invention further provides several methods for encapsulating the raised source/drain contacts to electrically isolate them from the gate.

BRIEF DESCRIPTION OF THE DRAWINGS

These and other features, objects, and advantages of the present invention will become apparent upon a consideration of the following detailed description of the invention when read in conjunction with the drawings, in which.

DESCRIPTION OF THE PREFERRED EMBODIMENTS

Figure 1:
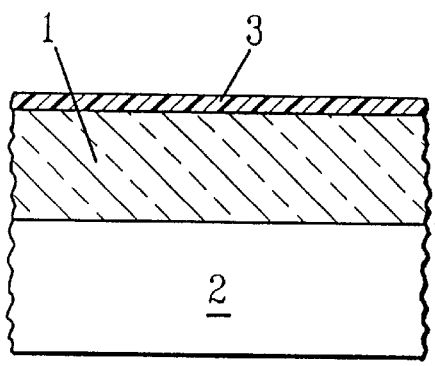
FIG. 1 is a cross sectional view illustrating early steps in forming the embodiment of FIG. 5.

The present invention which provides a method of forming self-aligned MOS FETs having submicron gate lengths and being T-shaped will now be described in greater detail with reference to the accompanying drawings wherein like reference numerals are used for like and corresponding elements of the drawings.

Referring now to the drawings, FIG. 1 shows a cross sectional view of a sacrificial layer 1 on substrate 2 with optional polish stop 3. Said optional polish stop 3 may be replaced or supplemented with one or more materials tailored to prevent damage from laser irradiation during GILD processing. Substrate 2 may be a single crystal semiconductor material suitable to form the channel of a MOS FET to be built. Substrate 2 may be, for example, silicon, silicon germanium, germanium, gallium arsenide, indium gallium arsenide, indium phosphide, or indium gallium arsenide phosphide. Sacrificial layer 1 is a material which may be selectively etched with respect to substrate 2, and optional polish stop 3 is a material which may be used as polish stop during chemical mechanical etching. Sacrificial layer 1 may be a material such as but not limited to, a low temperature deposited oxide such as $SiO_2$ deposited by chemical vapor deposition (CVD) using tetraethoxysilane (TEOS) as a precursor. Examples of optional polish stop 3 include, but are not limited to, TiN, $Si_3N_4$ or polysilicon.

Figure 2:
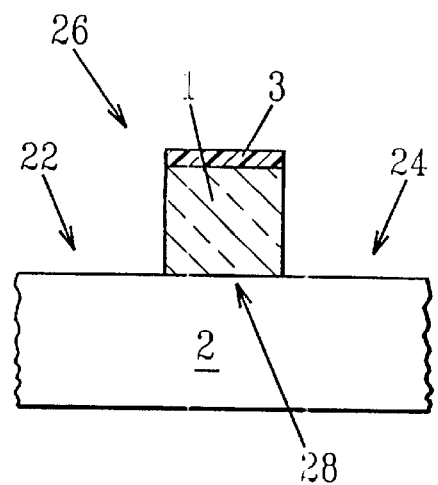
FIG. 2 is a cross sectional of the structure of FIG. 1 after the step of etching.
Figure 3:
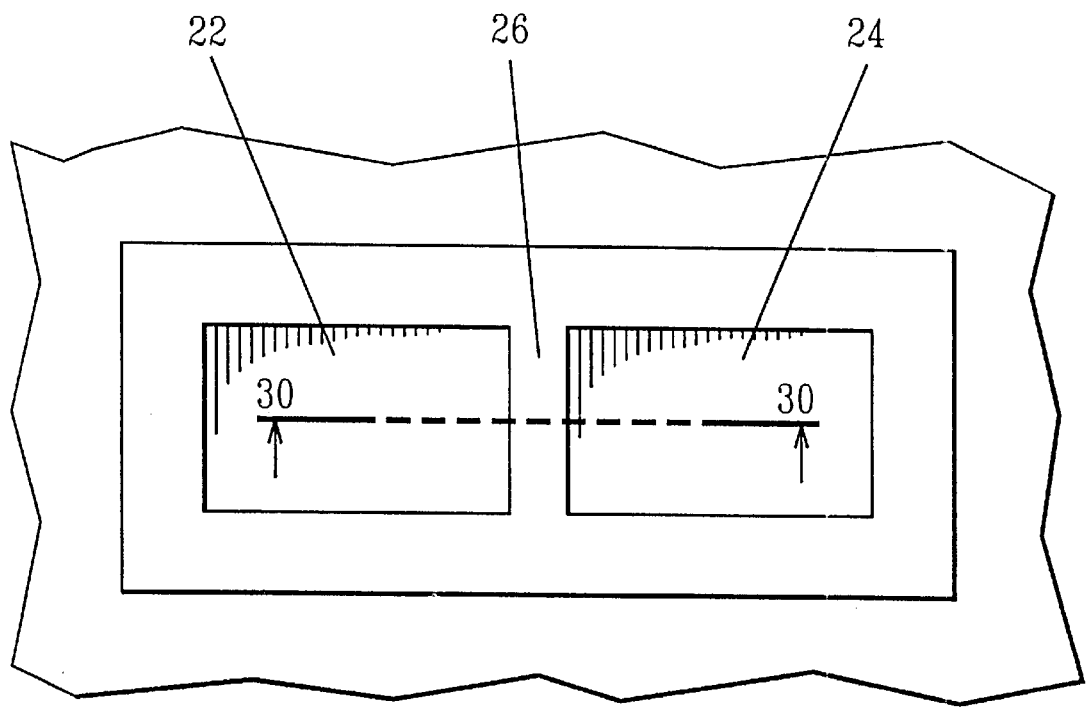
FIG. 3 is a top view along the line 30—30 of FIG. 2.

FIG. 2 shows the structure of FIG. 1 after sacrificial layer 1 and optional polish stop 3 have been patterned to leave a sacrificial gate shaped structure 26 over channel region 28, and open areas in the future source/drain regions 22 and 24. The lateral dimension of sacrificial gate shaped structure 26 would typically be equal to the minimum-lithography dimension. FIG. 3 shows a schematic top view of the structure, with line 30—30 corresponding to the region shown in the FIG. 2 cross section.

Figure 4A:
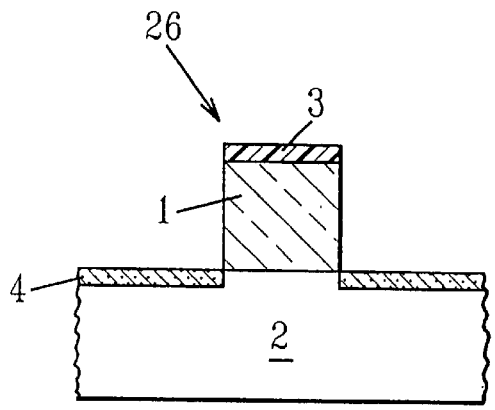
FIGS. 4A–4H are cross sectional views illustrating further steps in forming the embodiment shown in FIG. 5.
Figure 4B:
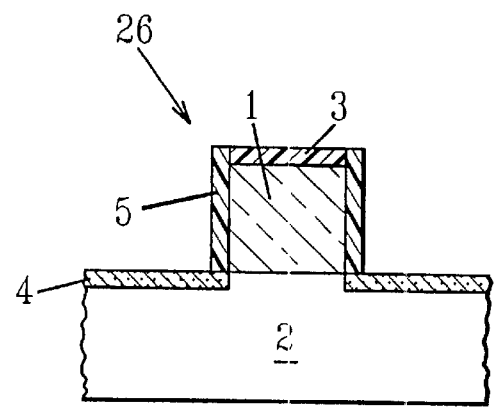
Figure 4C:
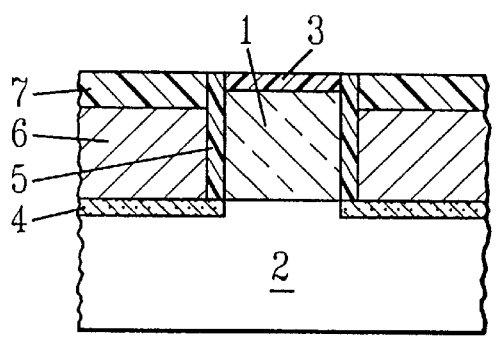
Figure 4D:
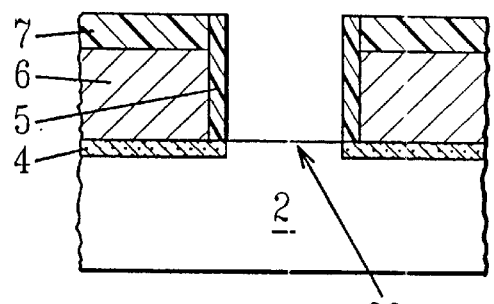
Figure 4E:
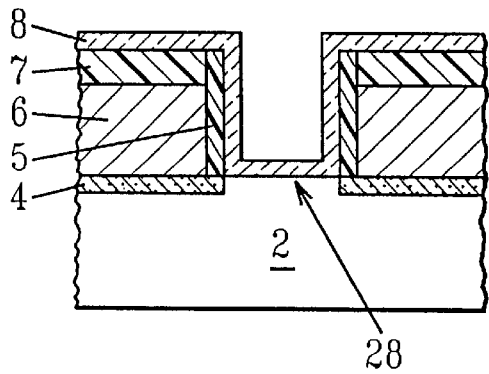
Figure 4F:
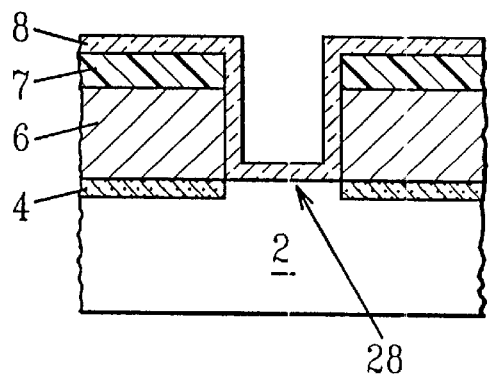
Figure 5:
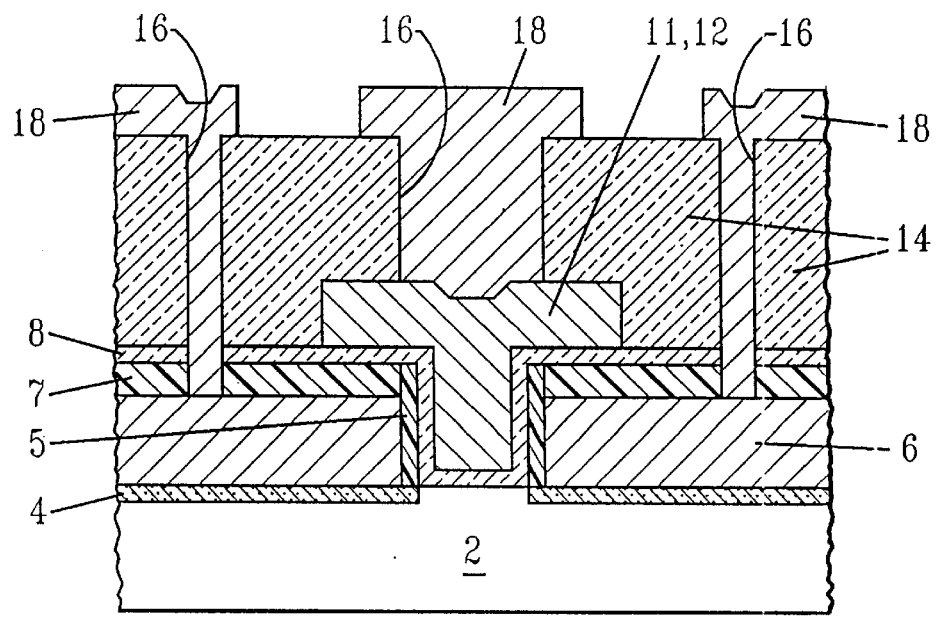
FIG. 5 is a cross sectional view of one embodiment of the present invention.

FIGS. 4A–4F are cross sectional views illustrating further steps in forming the embodiment shown in FIG. 5. FIG. 4A shows the structure of FIG. 2 after formation of shallow junction regions 4, and FIG. 4B shows the structure of FIG. 4A after formation of optional dielectric sidewall spacers 5. Dielectric sidewall spacers 5 may be formed, for example, by anisotropically etching a thin (20–50 nm) layer of conformally deposited sidewall spacer material.

FIG. 4C shows the structure of FIG. 4B after deposition of conductive source/drain contact metallurgy 6 and optional dielectric cap 7. Source/drain contact metallurgy 6 may be, for example, Co, Ni, Pd, Pt, Rh, Ta, Ti, W, conductive metal suicides, heavily doped polycrystalline silicon, or heavily doped polycrystalline silicon germanium, alone or in combination, and may be deposited, for example, by chemical vapor deposition (CVD), sputtering, or evaporation. Optional dielectric cap 7 and dielectric sidewall spacers 5 encapsulate the source/drain contact metallurgy. The materials of optional dielectric cap 7 and optional dielectric sidewall spacers 5 may be the same or different. Preferred materials include deposited dielectrics such as $SiO_2$, or $Si_3N_4$, and a dielectric metal oxide or nitride of metal 6.

FIG. 4D shows the structure of FIG. 4C after removal of the sacrificial gate shaped structure comprising sacrificial layer 1 and optional cap 3. Sacrificial layer 1 is preferably removed by wet etching to avoid reactive ion etching (RIE) damage to channel region 28. For the case where the material of optional dielectric sidewall spacers 5 is an oxide or nitride of metal 6, the optional dielectric sidewall spacers are preferably formed after removal of the sacrificial gate structure. Such sidewall spacers might be formed by an anodic oxidation process, or by oxidation consequent to formation of a thermal gate oxide, as described below.

Figure 4G:
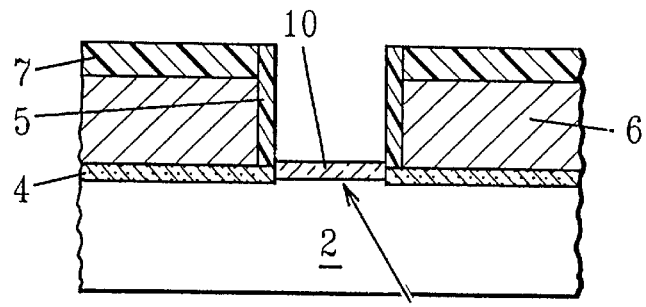

Next, gate dielectric 8 is formed on substrate 2 over channel region 28. In FIG. 4E, gate dielectric 8 is also formed on sidewall spacers 5 and insulating overlayer cap 7. Gate dielectric 8 may have a thickness in the range of from about 2 to about 10 nm. In the absence of optional dielectric sidewall spacers 5, gate dielectric 8 would be formed on substrate 2 over channel region 28, on the exposed sidewalls of source/drain contact metallurgy 6, and on dielectric cap 7, as shown in FIG. 4F. A spatially selective oxidation or nitridation step may also be used to form the gate dielectric 10 shown in FIG. 4G. For example, thermal oxidation may be used to form a thin oxide over channel region 28 if source/drain metallurgy 6 is encapsulated in a protective oxygen-impermeable dielectric such as silicon nitride. Alternatively, dielectric sidewall spacers comprising an oxide of metallurgy 6 might be formed in the same oxidation step used to form the gate dielectric.

Figure 4H:
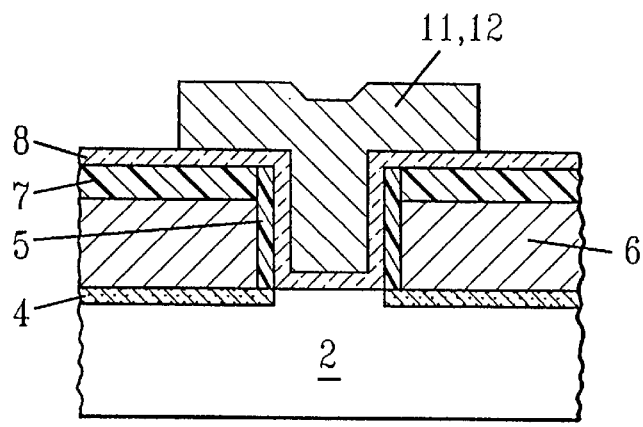

Referring to FIG. 4H, a gate material 11 which may be, for example, Al, W, with or without appropriate diffusion barriers and with or without polysilicon underneath, is formed over gate dielectric 8 and patterned lithographically to define a T-shaped gate 12. T-shaped gate 12 extends over optional dielectric cap 7, gate dielectric 8, and source/drain contact metallurgy 6. A negative resist may be used in the process of patterning lithographically.

An insulating material 14 which may be, for example, silicon dioxide or a flowable oxide is formed over exposed gate oxide 8 and T-shaped gate 12. Holes or openings 16 may be drilled through material 14 and filled with a conductive material 18 to provide contacts for circuit interconnections, as shown in FIG. 5. Material 18 may be, for example, tungsten, copper, chromium and the like.

Figure 6A:
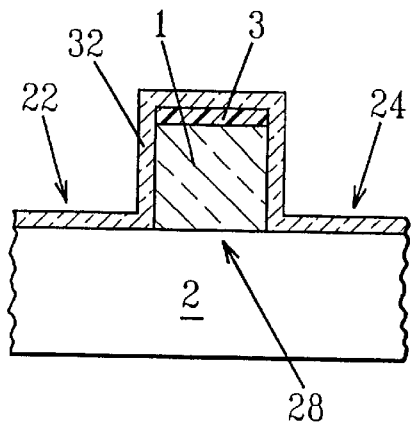
FIGS. 6A–6D are cross sectional views illustrating two methods of producing the shallow junction regions of FIG. 4A from the structure of FIG. 2; the methods comprise ion implantation followed by activation or gas immersion laser doping.
Figure 6B:
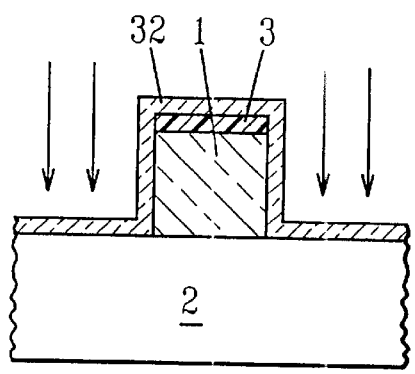
Figure 6C:
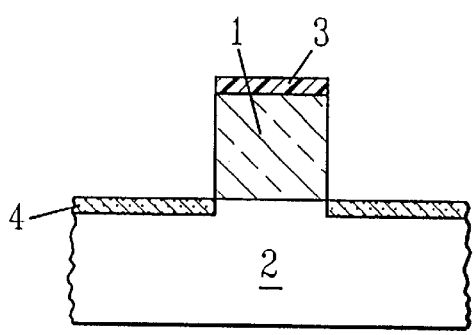

FIGS. 6A–6C are cross sectional views illustrating a preferred ion implantation method of producing the shallow junction regions of FIG. 4A from the structure of FIG. 2. A thin layer of screen material 32, such as, for example, $SiO_2$, silicon nitride, or titanium nitride, is applied to cover the intended source/drain junction regions 22 and 24 shown in FIG. 6A. Screen layer 32 may have a thickness in the range of from about 10 to about 90 nm, preferably about 50 nm. Source and drain regions 22 and 24 are then implanted with the appropriate ions to make shallow junctions, using the gate-shaped structure as a mask. The junction regions may be doped: p-type for a p-channel MOS FET and n-type for an n-channel MOS FET. Said p-type and n-type junctions may be formed on the same wafer by appropriate blocking masks. After activation annealing with screen layer 32 still in place, screen layer 32 is removed by a process such as selective wet etching to form the structure of FIG. 6C.

Figure 6D:
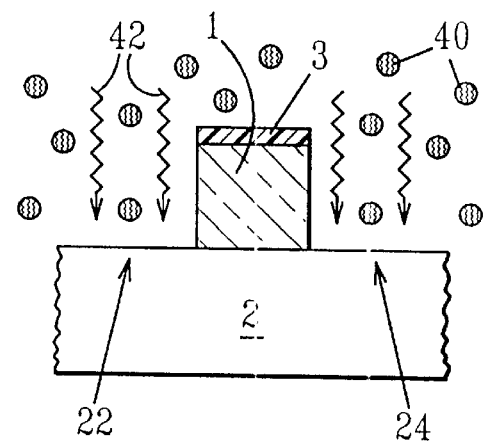

FIG. 6D is a cross sectional view illustrating a gas immersion laser doping method of producing the shallow junction regions of FIGS. 4A. A sample having the structure shown in FIG. 2 is placed in an ambient of a gas or liquid 40 containing the dopant atoms. Projected laser irradiation 42 temporarily melts a thin surface layer of the substrate in source and drain regions 22 and 24 allowing rapid and localized incorporation of dopant atoms throughout the melt depth. Projected laser irradiation 42 may be, for example, pulses of XeCl excimer laser radiation with a wavelength of about 308 nm and pulse duration of about 30 ns, and dopant gas 40 may be, for example $PH_3$. Optional polish stop 3 is preferably replaced or supplemented with one or more materials tailored to prevent damage from laser irradiation. Such layers might include aluminum (which is highly reflective), multilayers of $SiO_2$ and $Si_3N_4$ comprising a multilayer dielectric mirror at the laser wavelength, or absorbing materials such as W which have a high laser damage threshold.

Figure 7A:
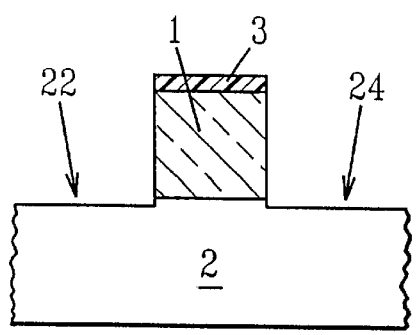
FIGS. 7A–7B are cross sectional views illustrating another method of producing the shallow junction regions of FIG. 4A from the structure of FIG. 2; the method comprises spatially selective epitaxial growth of an in-situ doped semiconductor.
Figure 7B:
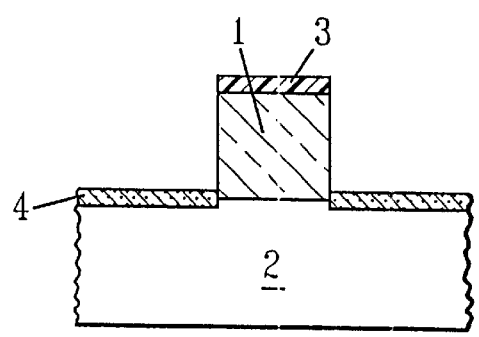

FIGS. 7A–7B are cross section view illustrating a preferred spatially selective epitaxial growth method of producing the shallow junction regions of FIG. 4A from the structure of FIG. 2. After optionally recessing source/drain regions 22 and 24 by a process such as thermal oxide growth and wet etchback to produce the structure of FIG. 7A, an in-situ doped semiconductor is epitaxially grown on the exposed semiconductor substrate regions to form source/drain junctions 4, as shown in FIG. 7B. Preferred in-situ doped semiconductor materials for a silicon substrate include in-situ doped silicon and in-situ doped SiGe.

Figure 8A:
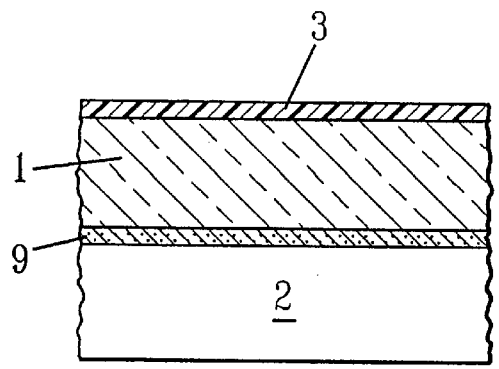
FIGS. 8A–8C are cross sectional views illustrating yet another method of producing the shallow junctions regions of FIG. 4A; the method comprises blanket epitaxial growth of an in-situ doped semiconductor followed by its selective removal from regions above the channel.
Figure 8B:
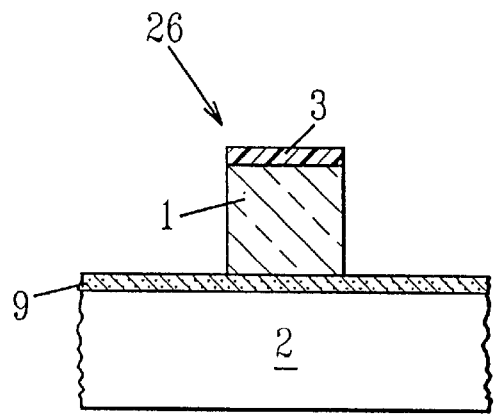
Figure 8C:
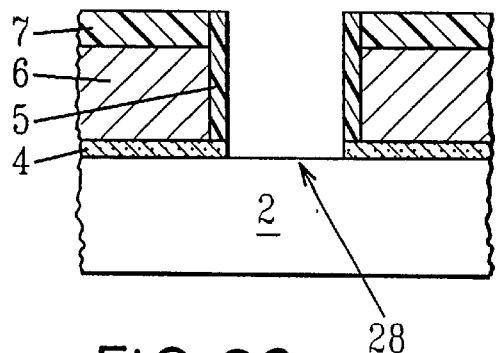

FIGS. 8A–8C are cross sectional views illustrating yet another method of producing the shallow junction regions of FIG. 4A. In this case one starts with the structure of FIG. 8A, comprising substrate 2, epitaxially grown in-situ doped semiconductor 9, sacrificial layer 1, and optional polish stop 3. Layers 3 and 1 are then patterned to produce gate shaped structure 26, as shown in FIG. 8B. After processing as shown in FIGS. 4B to 4C, layer 9 is selectively removed from above channel 28. Wet etching would be a preferable removal process to avoid RIE damage to channel 28.

FIGS. 9A–9E are cross sectional views illustrating a preferred method of forming self-aligned, insulation-encapsulated raised source/drain contacts starting from the structure of FIG. 4B. Material 15 for source/drain contact metallurgy is deposited over gate shaped structure 26 to produce the structure of FIG. 9A, and then planarized down to polish stop 3 to produce the structure of FIG. 9B with separated source/drain contacts 6. A preferred material for material 15 would be tungsten deposited by CVD, and a preferred planarization method is chemical mechanical polishing (CMP). Planarized source/drain contacts are then recessed with respect to the top surface of polish stop 3 by a process such as RIE to produce the structure of FIG. 9C. A dielectric cap layer 17 is then deposited to form the structure of FIG. 9D and planarized by a process such as CMP to form the structure of FIG. 9E with dielectric cap 7 on the source/drain regions. Dielectric cap layer 17 may be silicon nitride, $SiO_2$, or a flowable oxide. Polish stop 3 may be a nitride such as TiN or $Si_3N_4$, or polysilicon. The relative thickness of polish stop 3 and dielectric cap 7 are selected so that polish stop 3 and gate shaped structure 1 can be removed without entirely removing dielectric cap 7.

Figure 9A:
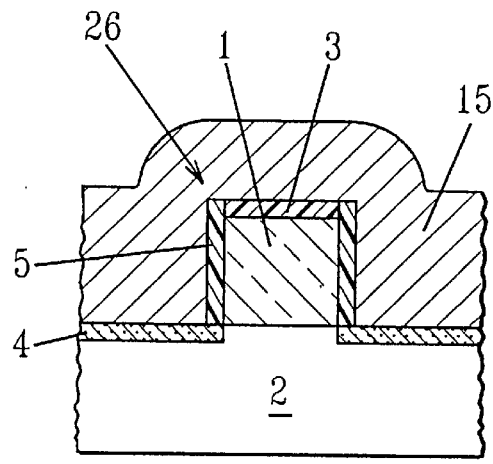
FIGS. 9A–9E are cross sectional views illustrating a preferred method of the present invention of forming self-aligned, insulation encapsulated raised source/drain contacts.
Figure 9B:
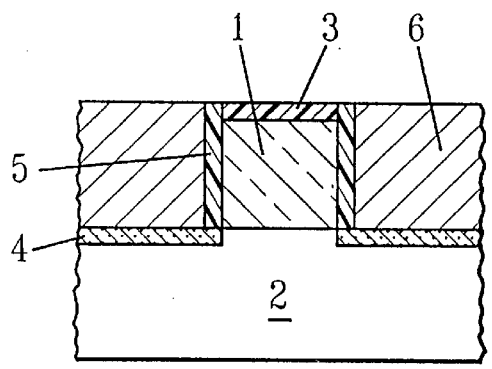
Figure 9C:
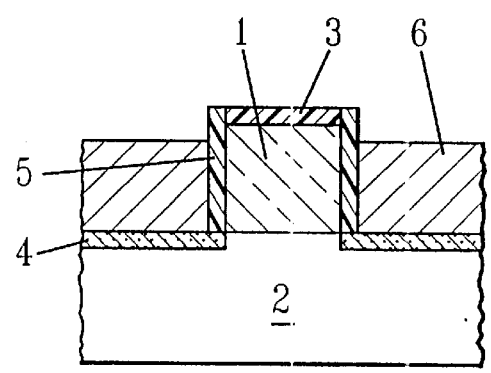
Figure 9D:
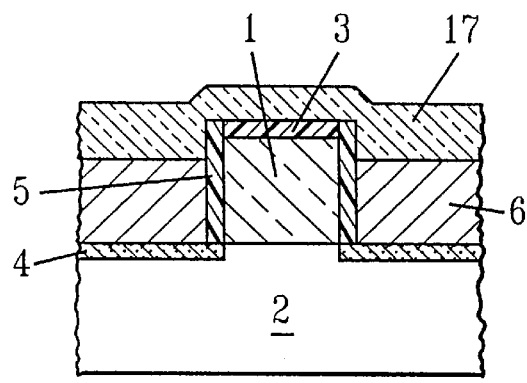

The structure of FIG. 9C may alternatively be formed from the structure of FIG. 4B by selectively growing material 15 in the source/drain regions. CVD processes are available to selectively grow tungsten on the silicon regions of a substrate comprising regions of silicon and regions of a second material such as $SiO_2$.

Figure 9E:
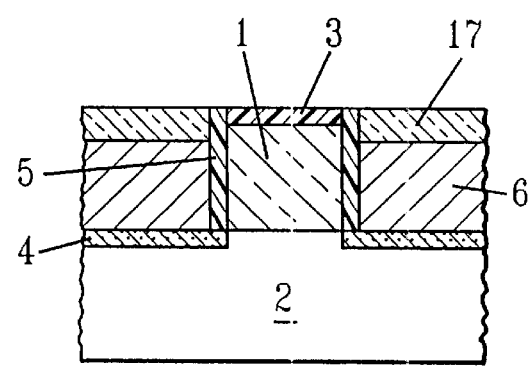

The structure of FIG. 9E may, alternatively, be formed from the structure of FIG. 9C by selectively growing a dielectric on the top surface of source/drain metallurgy regions 6. This may be accomplished by an oxidation or nitridation process. For example, source/drain metallurgy regions 6 of tungsten may be anodically or thermally oxidized to produce a surface layer of the dielectric $WO_3$.

The invention described herein can be used in fabricating field effect transistors (FETs), such as metal semiconductors FETs, modulation doped FETs, metal oxide semiconductor FETs and circuits. Compared to existing process steps of such FETS, the structure and process of this invention produce substantially reduced gate and source/drain resistances, resulting in higher FET device and circuit speeds and lower power consumption. The device design is easily scaled to smaller gate width and area without adversely affecting the gate resistance.

While there has been described and illustrated an FET structure with a T-shaped gate, and a method of fabricating such a structure based on forming raised source/drain contacts self-aligned to preexisting junction regions prior to forming a self-aligned gate dielectric and T-shaped gate, it will be apparent to those skilled in the art that modifications and variations are possible without deviating from the broad scope of the invention which shall be limited solely by the scope of the claims appended hereto.

Having thus described our invention, what we claim as new, and desire to secure by letters patent is:

1. A method of forming a field effect transistor comprising the steps of:

forming at least one sacrificial layer on at least one surface of a semiconductor substrate, patterning said at least on sacrificial layer to form a sacrificial gate shaped structure surrounded by exposed substrate regions, forming doped semiconductor junction regions in said exposed substrate regions on opposite sides of said sacrificial gate shaped structure, forming source and drain contact metallurgy on said junction regions, said contact metallurgy having a thickness less than the thickness of said gate shaped structure, selectively forming a dielectric cap layer over regions of said source and drain contact metallurgy, wherein said dielectric cap layer has a top surface that is approximately even with the top surface of said sacrificial gate shaped surface, removing said sacrificial gate shaped structure to exposed underlying regions of said substrate and sidewalls of said source and drain contact metallurgy, depositing a gate dielectric to cover said exposed substrate regions and sidewalls and top of said source and drain contact metallurgy, forming a conductive layer on all surfaces of said gate dielectric, said conductive layer also substantially filling the volume formerly occupied by the sacrificial gate shaped structure, and patterning said conductive layer to define a gate electrode.

2. The method of claim 1, wherein said semiconductor material is a single crystal material selected from the group consisting of GaAs, InGaAs, InP, Si, InGaAsP and SiGe.

3. The method of claim 1, wherein said step of forming at least one sacrificial layer includes the step of selecting a bottom layer material from the group consisting of $SiO_2$ tetraethoxysilane (TEOS) derived oxides, flowable oxides and $Si_3N_4$, and a top layer selected from the group consisting of $SiO_2$, tetraethoxysilane (TEOS) derived oxides and flowable oxides, $Si_3N_4$, TiN and silicon.

4. The method of claim 1, wherein said step of forming source and drain contact metallurgy includes the step of selecting at least one contact metallurgy material from the group consisting of Co, Ni, Pd, Pt, Rh, Ta, Ti, W, conductive silicides of these metals, heavily doped polycrystalline silicon, and heavily doped polycrystalline silicon germanium.

5. The method of claim 1, wherein said step of forming a dielectric cap on said source and drain contact metallurgy includes the step of selecting a dielectric material from the group consisting of planarizable dielectrics, dielectric oxides and dielectric nitrides.

6. The method of claim 5, wherein said dielectric cap comprises a planarizable dielectric selected from the group consisting of $SiO_2$, tetraethoxysilane (TEOS) derived oxides, flowable oxides and $Si_3N_4$.

7. The method of claim 5, wherein said dielectric cap comprises a dielectric oxide selected from the group consisting of $Tio_2$, $Ta_2O_5$ and $WO_3$.

8. The method of claim 1, wherein said step of forming doped semiconductor junctions includes ion implantation and activation annealing.

9. The method of claim 1, wherein said step of forming doped semiconductor junctions includes gas immersion laser doping.

10. The method of claim 1, wherein said step of forming doped semiconductor junctions includes the selective epitaxial growth of a dopied semiconductor on said exposed substrate regions not covered by said sacrificial gate.

11. The method of claim 1, wherein said step of forming source and drain contact metallurgy on said junction regions includes the step of blanket deposition of said contact metallurgy material planarization.

12. The method of claim 11, wherein said planarization is carried out by chemical mechanical polishing.

13. The method of claim 11, further comprising the step of recessing top surface of source and drain contact metallurgy to a level below top surface of the sacrificial gate shaped structure by selective etching.

14. The method of claim 1, wherein said step of forming source and drain contact metallurgy on said junction regions includes the steps of selective growth of said contact metallurgy material on said junction regions.

15. The method of claim 1, wherein said step of forming said dielectric cap layer includes the step of blanket deposition and planarization of material for said dielectric cap.

16. The method of claim 1, wherein said step of forming said dielectric cap layer includes the step of growing said cap layer on the contact metallurgy top surface by a process selected from the group consisting of oxidation and nitridation.

17. The method of claim 16, wherein said oxidation is thermal oxidation or anodic oxidation.

18. The method of claim 1, further comprising the step of forming dielectric sidewall spacers on the sacrificial gate shaped structure, said dielectric spacers being formed from a material that is substantially different from the material of said sacrificial gate shaped structure.

19. The method of claim 1, further comprising the step of growing dielectric sidewall spacers on the sidewalls of said source and drain contact metallurgy by a process selected from the group consisting of oxidation and nitridation.

20. The method of claim 19, wherein said oxidation is a thermal oxidation or anodic oxidation.

21. A method of forming a field effect transistor comprising the steps of:

forming at least one sacrificial layer on at least one surface of a semiconductor substrate, patterning said at least on sacrificial layer to form a sacrificial gate shaped structure surrounded by exposed substrate regions, forming doped semiconductor junction regions in said exposed substrate regions on opposite sides of said sacrificial gate shaped structure, selectively forming source and drain contact metallurgy on said junction regions, selectively forming a dielectric cap on said source and drain contact metallurgy, removing said sacrificial gate shaped structure to exposed underlying regions of said substrate and sidewalls of said source and drain contact metallurgy, depositing a gate dielectric to cover said exposed substrate regions and sidewalls and top of said source and drain contact metallurgy, forming a conductive layer on all surfaces of said gate dielectric, said conductive layer also substantially filling the volume formerly occupied by the sacrificial gate shaped structure, and patterning said conductive layer to define a gate electrode.

22. A field effect transistor comprising:

a semiconductor substrate, two spaced apart doped semiconductor regions forming source and drain junction regions and defining a channel substrate region therebetween, a first conductive layer over said junction regions, said first conductor layer forming source and drain contact metallurgy, a first dielectric layer on top surfaces of said contact metallurgy, a gate dielectric on said channel substrate region extending over sidewalls and top surfaces of said contact metallurgy, and a gate having a T-shaped cross section comprising a second conductive layer on said gate dielectric and extending over first dielectric layer and portion of the source and drain contact metallurgy.

23. A field effect transistor comprising the structure of claim 22, said structure further comprising dielectric sidewall spacers interposed between the gate dielectric and the sidewalls of the contact metallurgy.

24. A field effect transistor comprising the structure of claim 22, said structure having no gate dielectric on sidewalls or source/drain top.

25. A field effect transistor comprising the structure of claim 23, said structure having no gate dielectric on sidewalls or source/drain top.

26. A method of forming a field effect transistor comprising the steps of:

forming at least one sacrificial layer on a single crystal semiconductor substrate, patterning said at least on sacrificial layer to form a sacrificial gate shaped structure surrounded by exposed substrate regions, forming doped semiconductor junction regions in said exposed substrate regions on opposite sides of said sacrificial gate shaped structure, forming source and drain contact metallurgy on said junction regions, said contact metallurgy having a thickness less than the thickness of said gate shaped structure, selectively forming a dielectric cap layer over regions of said source and drain contact metallurgy, wherein of said dielectric cap layer has a top surface that is approximately even with top surface of said sacrificial gate shaped surface, removing said sacrificial gate shaped structure to exposed underlying regions of said substrate and sidewalls of said source and drain contact metallurgy, depositing a gate dielectric to cover said exposed substrate regions but not said sidewalls of said source and drain contact metallurgy, forming dielectric sidewall spacers on said side walls of said source and drain contact metallurgy, forming a conductive layer over said gate dielectric and said source and drain contact metallurgy, said conductive layer also substantially filling the volume formerly occupied by the sacrificial gate shaped structure, and patterning said conductive layer to define a gate electrode.

27. The method of claim 26, wherein said step of forming said dielectric sidewall spacers on said sidewalls of said source and drain contact metallurgy further includes selecting a spacer dielectric that is substantially different from the material of said sacrificial gate shaped structure.

28. The method of claim 26, wherein the step of forming said dielectric sidewall spacers on the sidewalls of said source and drain contact metallurgy is by a process selected from the group consisting of oxidation and nitridation.

29. The method of claim 28, wherein said oxidation is thermal oxidation or anodic oxidation.

* * * * *